US006445264B1

(12) United States Patent
Pond

(10) Patent No.: US 6,445,264 B1
(45) Date of Patent: Sep. 3, 2002

(54) MOBIUS RESONATOR AND FILTER

(75) Inventor: Jeffrey M. Pond, Woodbrige, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 2 days.

(21) Appl. No.: 09/590,365

(22) Filed: Jun. 9, 2000

(51) Int. Cl.[7] .................................................. H03H 7/01

(52) U.S. Cl. ........................ 333/172; 333/184; 333/202

(58) Field of Search ................................ 333/202, 172, 333/184, 185

(56) References Cited

U.S. PATENT DOCUMENTS 4,599,586 A * 7/1986 Brown ....................... 333/202

* cited by examiner

*Primary Examiner*—Robert Pascal
*Assistant Examiner*—Dean Takaoka
(74) *Attorney, Agent, or Firm*—John J. Karasek; George A. Kap

(57) ABSTRACT

An electromagnetic resonator and a frequency filter. The resonator is composed of an electromagnetic waveguiding structure which is twisted along its axis while being bent back and the two ends connected smoothly to provide a smooth path to the electromagnetic wave, the twist providing additional phase shift to facilitate a resonant condition in a smaller volume. The filter includes one or more coupled resonators which are coupled in a controlled fashion to an external circuit to realize a desired frequency selectivity.

13 Claims, 4 Drawing Sheets

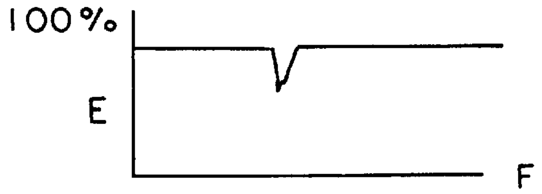
FIG. 12
FIG. 13
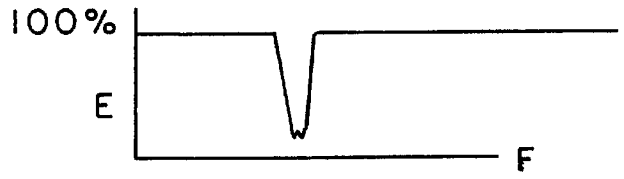
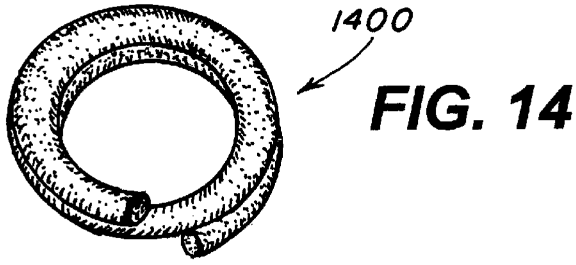
FIG. 14
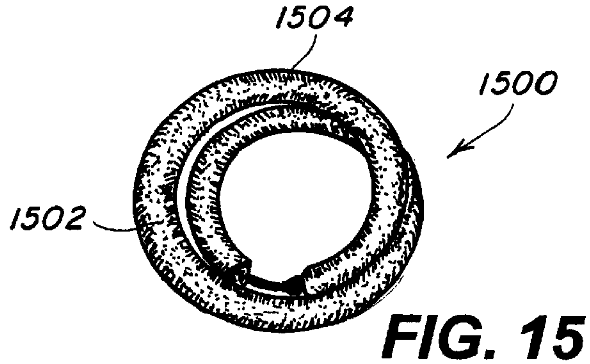
FIG. 15
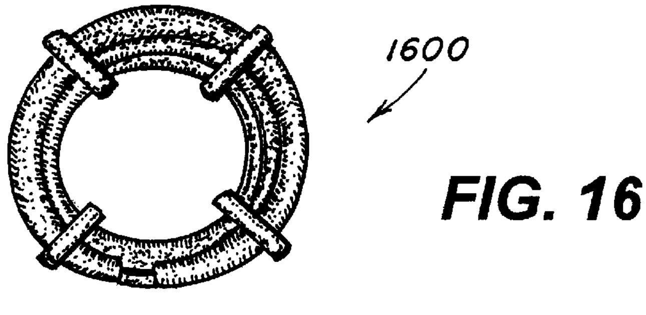
FIG. 16

MOBIUS RESONATOR AND FILTER

BACKGROUND OF THE INVENTION

1. Field of the Invention

This invention pertains to the field of electromagnetic devices in the form of resonators and frequency filters.

2. Description of Related Art

A resonator is typically defined as a device that exhibits resonance at a particular frequency, such as an acoustic resonator or cavity resonator. Electronic devices in the form of resonators are often geometrical arrangements of conductors, dielectrics, magnetic materials, etc., where an electromagnetic wave can exist at only discrete resonant frequencies. These resonant frequencies are those frequencies at which Maxwell's equations and the boundary conditions and or field matching conditions imposed by the geometry of the structure can simultaneously be satisfied. Examples of resonators using boundary conditions to establish resonant frequencies are transmission lines, such as micro strip and rectangular waveguides, where boundary conditions are placed a half-wavelength apart for the lowest resonant frequency along the transmission line. Alternatively, field matching conditions can be used to establish a resonant condition using the transmission line, the microstrip ring resonator being a prime example. The requirement that the electromagnetic fields be continuous imposes a resonant condition by requiring that the circumference of the ring be an integer number of wavelengths. The symmetry of a ring resonator results in two orthogonal degenerate modes of sin $\theta$ and cos $\theta$ angular dependency. Resonators with degenerate modes are often not the best choice for a simple resonator since any lack of perfect symmetry leads to a splitting of the degeneracy and the result is two resonances with nearly the same frequency. However, this same property can be quite useful when implementing filters, since n dual-mode resonators can be used to implement a 2n-pole filter, whereas it would require 2n single-mode resonators to realize a 2n-pole filter.

Although there are many different resonator geometries including rectangular waveguides, microstrips, and dielectrically loaded cavities, the physical size of any particular resonator type is largely determined by the wavelength of the electromagnetic wave at the resonant frequency. Common to these resonators is the fact that an electromagnetic wave must experience a change in phase along the geometry of the structure. The phase change required over the geometry is dependent on the boundary and or field matching conditions that must be satisfied, but is most often one quarter, one half, or one wavelength long. Given a particular uniform structure, the size is largely determined by the phase change that must be experienced in order to satisfy the boundary and or field matching requirements.

The Mobius strip is a known concept. It is perhaps the most well known surface that falls within the study of topology. The Mobius strip has several interesting properties for a finite three dimensional object: it has only one surface and only one edge. The deformation of the rectangle that takes place in forming a Mobius strip is a rotation of the geometry through 180 degrees. At a particular frequency, f, if a section of transmission line a half wavelength long were bent back on itself, resonance could not occur as the field would not match. Indeed, the wave at both "ends" would be 180 degrees out of phase. The line would need to be a full wavelength long for this approach to yield a resonant condition, alternatively, it would have a resonant condition at a frequency of 2f.

OBJECTS AND BRIEF SUMMARY OF THE INVENTION

It is an object of this invention to reduce size and/or weight of a resonator.

Another object of the invention is to reduce length of a wave, i.e., wavelength, and still obtain a resonant frequency.

Another object of the invention is to introduce at least one twist or cross-over, via a homoamorphic deformation, into a waveguiding structure and still come up with a resonant frequency.

These and other objects of this invention are attained by twisting a waveguiding structure so that a wave traveling on the waveguiding structure, where the ends of the strip resonator are found, is continuous and produces resonant frequency, the resonator having reduced size and/or weight.

BRIEF DESCRIPTION OF THE DRAWINGS

FIG. 12 is a plot of Frequency vs. Energy for weakly coupled dual resonator filter shown in FIG. 11.

FIG. 13 is a plot of Frequency vs. Energy for conventionally coupled dual mode band reject filter arrangement shown in FIG. 11.

FIG. 14 shows a 4 $\pi$ helix made from an insulated wire.

FIG. 15 shows a circular 4 $\pi$ Mobius resonator made from insulated wire wherein the wire ends are soldered together.

FIG. 16 shows a circular 8 $\pi$ Mobius resonator made from insulated wire wherein the wire end are soldered together.

DETAILED DESCRIPTION OF THE INVENTION

This invention pertains to an electromagnetic device and filter. The device is in the form of a wave guiding structure in Lens Space that can be used as a resonator in filters which function to provide frequency selectivity. Communication systems including cellular phones, radar and electronic warfare equipment, typically use filters which incorporate more than one resonator.

The resonator of this invention is characterized by having a twist or a cross-over in the surface structure of a resonator so that the surface structure provides a continuous electromagnetic path to a wave, multiple waves, or a fraction of a wave.

This invention will be described in connection with the conceptual representative of a resonator as depicted in FIGS. 1–4, embodiments of the novel resonator described in connection with FIGS. 6–10, a filter illustrated in FIG. 11, and plots in FIGS. 5, 12, and 13.

Figure 1:
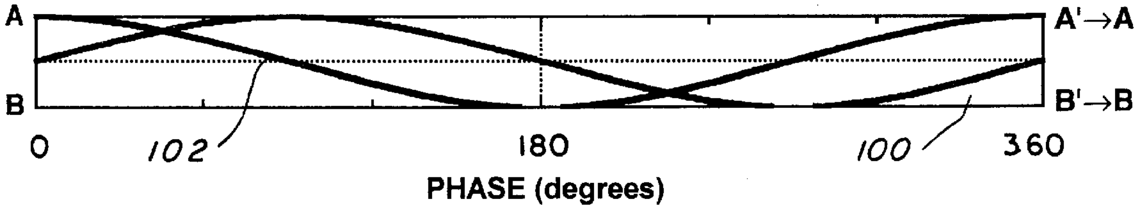
FIG. 1 shows a conceptual representation of a resonator with sinusoidal and cosinusoidal patterns of one wavelength of a signal on a transmission line.

Conceptual representation of a resonator in FIG. 1 shows surface structure 100 denominated horizontally in degrees and one wavelength sinusoidal wave 102 that starts at 0° at the top left portion of structure 100, proceeds sinusoidally down to 180° and then up to 360° at the top right portion of the structure 100. The horizontal axis, denoted in degrees, is directly proportional to the physical length of a wave. Top left portion of structure 100 at 0° is denoted as A, bottom portion of structure 100 at 0° is denoted as B, top right portion structure 100 at 360° is denoted as A', and bottom portion of structure 100 at 360° is denoted as B'. If the length of the structure is smoothly bent around on itself such that A connects to A' and B connects to B', then the sinusoidal wave pattern and its derivatives matches which is consistent with resonance. FIG. 1 is a graphical representation of a ring resonator.

Figure 2:
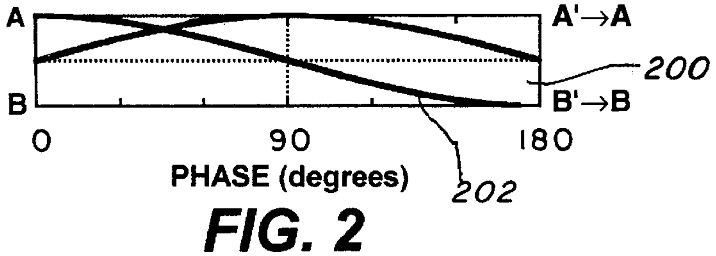
FIG. 2 is similar to FIG. 1 where the wavelength is half-wavelength long ending at 180 degrees.

FIG. 2 shows surface structure 200 denominated in degrees along the horizontal axis and a sinusoidal wave 202 that starts at 0° or the top left portion of structures 200 and proceeds sinusoidally down to 180° where it terminates. Corners of structure 200 in FIG. 2 are denoted as A, A', B and B', same as in FIG. 1. In FIG. 2, length of structure is one half of a wavelength long, starting at 0° and terminating at 180°. It is apparent that if the same procedure is followed as with the FIG. 1 representation and bend the structure in of FIG. 2 back on itself such that A connects to A' and B connects to B', the sinusoidal pattern does not match and the resonance condition cannot occur at this frequency.

Figure 3:
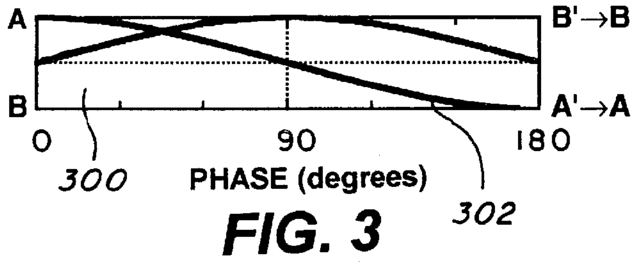
FIG. 3 is similar to FIG. 1 but shows the half-wavelength sinusoidal pattern twisted so that when opposite ends are joined, the wave is continuous.

FIG. 3 shows surface structure 300 denominated in degrees along the horizontal axis and a sinusoidal wave 302 that starts at 0° or the top left portion of structure 300 and proceeds sinusoidally down to 180° where it terminates. Top left corner of structure 300 at 0° is denoted as A, bottom portion of structure 300 at 0° is denoted as B, top right portion of structure 300 at 180° is denoted as B', and bottom portion of structure 300 at 180° is denoted as A'. FIG. 3 is the same as FIG. 2 with the exception of a 180° twist imparted to structure 200 in FIG. 2 with the result that the sinusoidal wave pattern is at the top right portion of structure 300. Thus when structure 300 is bent on around itself, A will connect to A' and B will connect to B', thus providing a continuous path for wave pattern 302 and its derivatives and meeting the resonance condition. Same applies to multimode resonators.

Also shown in FIGS. 1, 2 and 3 are the cosinusoidal waves which are orthogonal to the sinusoidal waves and for which an analogous argument applies. It is assumed that claims herein include resonators operating as single mode resonators, i. e., sinusoidal wave or cosinusoidal wave, and dual mode resonators which simultaneously use both sinusoidal and cosinusoidal waves.

It should be understood that multiple twists or cross-overs can be provided in a resonator and a resonance condition will be met if a continuous path is provided for the wave.

As should be apparent from the disclosure and discussion in connection with FIGS. 1–3, what is disclosed herein is a concept to induce a geometric distortion in a transmission line resonator in a manner analogous to the deformation of a rectangle that differentiates a mobius strip from a cylindrical loop. This results in resonators where the phase change needed for resonance has contributions from the wavelength as well as the geometric deformation of the resonator.

Figure 4:
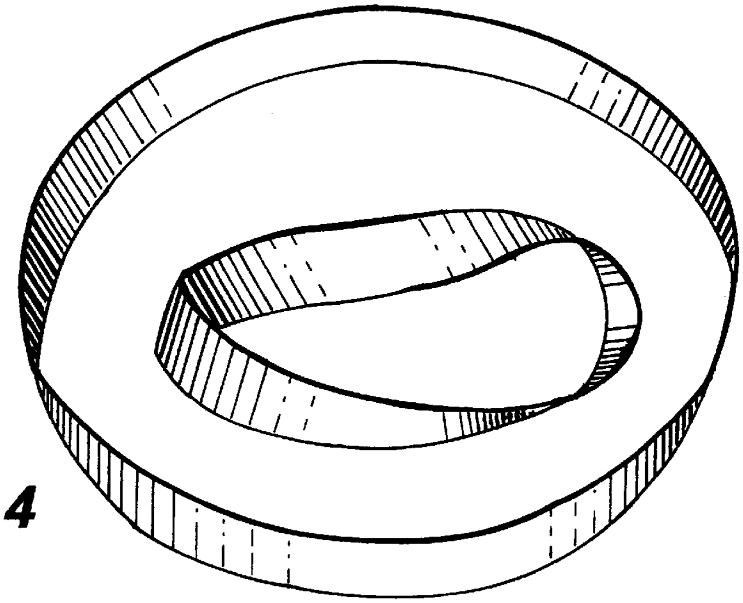
FIG. 4 shows two resonators with resonance conditions, the smaller resonator being disposed within the larger one having a twist therein and being one-half smaller in circumference than the larger resonator.

FIG. 4 is a graphical representation of the resonace conditions of the larger conventional resonator 400 without a twist surrounding the smaller novel resonator 402 with one twist. Even though both resonators 400 and 402 have the resonance frequency, there is a noticeable size advantage in the inner smaller and lighter resonator 402. A resonator containing one twist will be one-half in circumference and will have one-quarter the weight and volume compared to a conventional like resonator without the twist.

Figure 5:
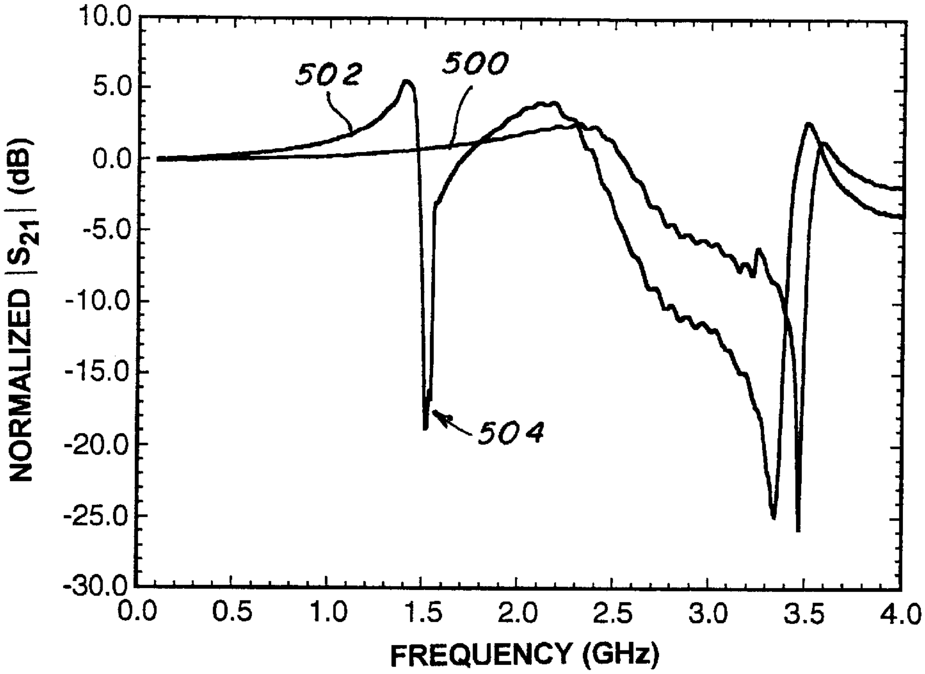
FIG. 5 is a-comparison graph between a control resonator without a twist and one with a twist in terms of variation in frequency versus energy intensity.

FIG. 5 is a plot comparing frequency and field (energy) intensity (normalized $|S_{21}|$) of a control resonator without a twist and a like novel resonator with a twist, the resonators having the same diameter. Plot 500 is for the control resonator and plot 502 is for the novel twist resonator. Of note is the fact that a downward spike in energy intensity for the novel twist resonator 502 occurs at a frequency of 1.5 GHz whereas for the conventional resonator, it is at 3.5 GHz. In an ideal situation, the spike for the conventional resonator 500 would be at 3.0 Ghz, or double that for the twist resonator. The double spike at 1.5 Ghz for the twist resonator at point 504 indicates that it is dual mode.

Figure 6:
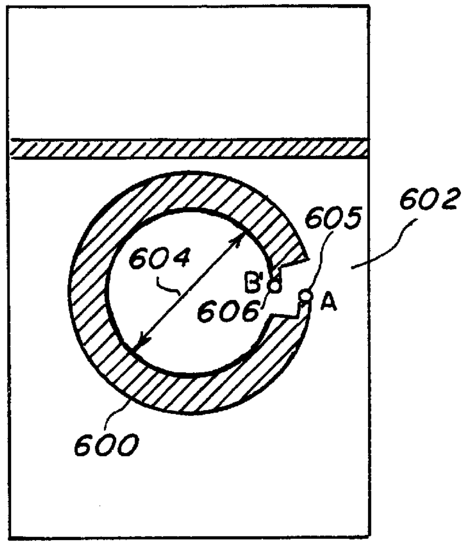
FIG. 6 is the top view of a planar resonator in circular form mounted on an electrically nonconducting substrate.
Figure 7:
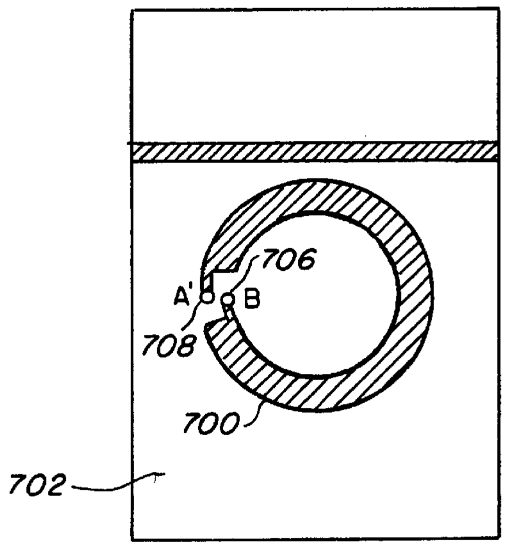
FIG. 7 is the bottom view of the planar resonator of FIG. 6 on a strip in circular form mounted on an electrically insulating substrate.
Figure 8:
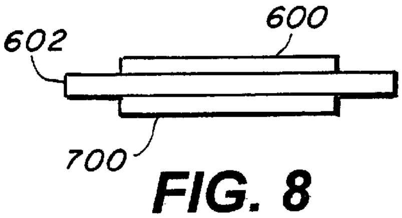
FIG. 8 is a side view of the planar resonator of FIG. 6 and 7 showing top and bottom metal strip layers mounted on an electrically insulating substrate.

FIGS. 6–8 show a planar resonator with a twist or cross-over. FIG. 6 is the top view of the twist planar resonator which is composed of C-shaped strip 600 of an electrically conducting metal, such as copper, mounted on insulating substrate 602. In a specific embodiment, mean diameter 604 is 3 cm and the strip 600 is of copper about 0.6 cm in thickness and 0.45 cm wide. The substrate in the specific embodiment is rectangular made of Teflon about 5 cm×7.5 cm and about 0.32 cm thick. The inner edge of strip 600 has contact 606 or B' extending from the open portion of the C-shaped strip 600 at about the 3 o'clock position (90° from vertical)and the outer edge has contact 608 or A also extending from the open portion of the C-shaped strip 600 at about the 3 o'clock position. Holes are provided through substrate 602 under contacts 606 and 608, as shown in FIG. 6.

FIG. 7 is the bottom view of the twist resonator of FIGS. 6–8 which is composed of C-shaped strip 700 of an electrically conducting metal, such as copper, mounted on the underside of the same insulating substrate 702 in mirror image to the C-shaped strip 600. Substrate 702 in FIG. 7 is the same one as substrate 602 in FIG. 6. Also, the C-shaped strip700 is of the same material and has the same dimensions as the strip 600 in FIG. 6. The inner edge of strip 700 has contact 706 or B extending from the open portion of the C-shaped strip 700 at about the 9 o'clock position (270° from vertical) and the outer edge has contact 708 or A' also extending from the open portion of the C-shaped strip 700 at about the 9 o'clock position. By connecting contacts A to A' and B to B' the twist is introduced into the resonator of FIGS. 6–8. The connection can be accomplished by inserting short wires through the openings in the Teflon substrate and soldering the wires to the top and bottom conductor strips.

FIG. 8 is a side view of the assembled planar resonator described in connection with FIGS. 6 and 7. FIG. 8 is a side view of the planar resonator taken for reference purposes from the left side of FIG. 6 and shows C-shaped strip 600 as the top layer on substrate 602 with C-shaped strip 700 as the bottom layer disposed on the opposite side. The C-shaped strips 600 and 700 are electrically connected to each other through the openings in the substrate, as already described, providing a continuous path for a wave pattern along C-shaped strips 600 and 700 and presenting a resonance condition, if that is desired and designed into the resonator.

Figure 9:
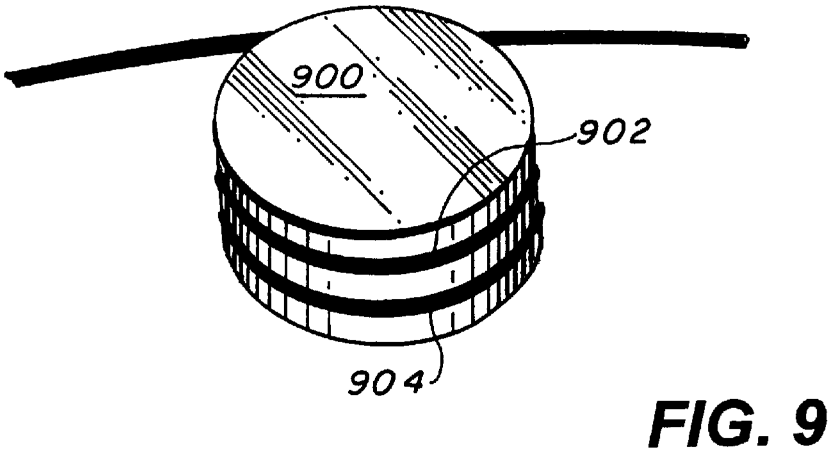
FIG. 9 is a twin lead resonator mounted on an insulating disk.
Figure 10:
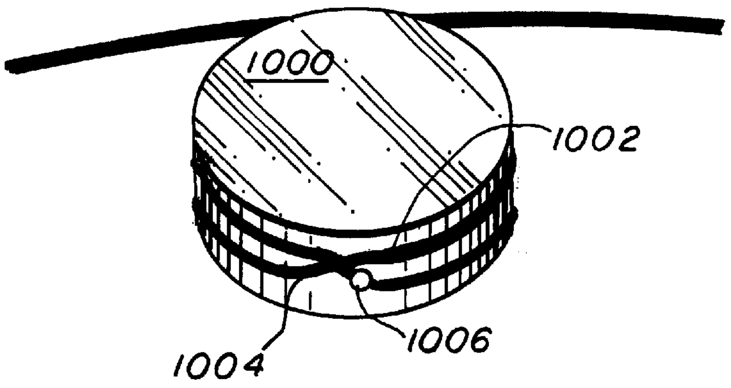
FIG. 10 is a twin lead resonator similar to that shown in FIG. 9 but with a twist or cross-over mounted on an insulating disk.

FIGS. 9 and 10 illustrate another embodiment of a resonator. FIG. 9 illustrates a conventional resonator without a twist and shows a disk 900 of an insulating material with a pair of parallel and spaced grooves in its outer circumferential surface. First wire 902 is disposed in one groove with its ends connected to themselves, i.e., end of the first wire or A is connected to end 2 of the first wire or A', to use designations of FIGS. 1–3. Second wire 904 is disposed in the other groove with its ends connected to themselves, i.e., end 1 of the second wire or B is connected to end 2 of the second wire or B', to use designations of FIGS. 1–3.

FIG. 10 illustrates a resonator with a twist or a resonator of this invention. In FIG. 10, like FIG. 9, is illustrated a disk 1000 with a pair of parallel and spaced grooves in its outer circumferential surface. First wire 1002 is disposed in one groove and second wire 1004 is disposed in he other groove. Instead of being joined end-to-end, the two wires shown in FIG. 10 go through a juncture point 1006 where the twist is introduced. Juncture point 1006 is a section on the outer circumferential surface where a portion of the disk is removed, including portions of the two grooves, where the twist is introduced. The twist is introduced by joining one end of the first wire to an end of the second and joining the other end of the first wire to the other end of the second wire, or to use designations of FIGS. 1–3, the connection is made by joining A to A' and B to B'. The connections are made as by soldering the wire ends. The twist or cross-over is visible in FIG. 10. Thus the two wire conductors are electrically connected to each other and as far as DC current is concerned, a continuous path is provided over the two wires. Effectively it is like wrapping one wire around twice and soldering the two ends together and yet ensuring the wire conductors do no touch elsewhere.

In a specific example of the FIGS. 9 and 10 resonators, the disks were made of Lucite® material the disks had diameters of 2.2 cm and were 0.8 cm thick, the wires were copper with approximate diameter of 0.04 cm and were spaced 0.32 cm apart. The resonators were identical except for the twist in the FIG. 10 resonator. The FIG. 5 plot is for FIGS. 9 and 10 resonators and shows that frequency can be reduced by one-half if diameter of a resonator is kept constant. If a resonator is reduced by one-half, as illustrated in FIG. 4, the smaller twist resonator can do everything that a larger one can.

Although the resonators illustrated herein are circular or in the form of a ring, it should be understood that resonators can be in any other desired form. In fact, the resonators in use are often rectangular.

As used herein, a twist, if it is a physical twist, as illustrated in connection with FIG. 4, is typically a twist of 180°, however, it is contemplated herein that a twist could be less or more than 180°. The Criterion that governs is that the twist results in a continuous path for a wave. The twist, as used herein, need not be a physical twist, but a twist or cross-over such as illustrated by the twist resonators illustrated in FIGS. 6–8 and FIG. 10 where the twist is introduced by cross-over connection which provides a continuous path for a wave pattern resulting in resonant condition at a particular frequency.

Figure 11:
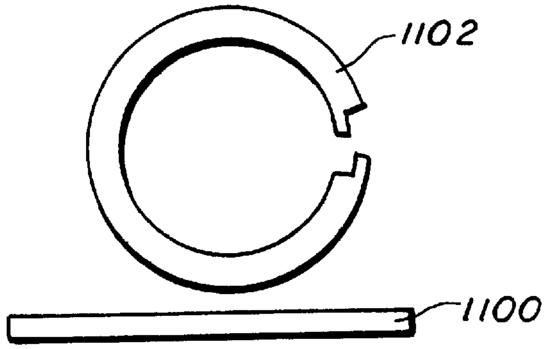
FIG. 11 is an illustration of a frequency filter composed of a transmission line and a resonator.

FIG. 11 illustrates a filter arrangement wherein transmission line 1100 is associated with a dual mode twist resonator 1102. The resonator 1102 is shown spaced from the transmission line 1100 although the resonator can be in physical contact with the transmission line. When the resonator is spaced from the transmission line, it is activated by the evanescent field that exists around the transmission line. The closer the resonator is spaced from the transmission line, the stronger is the evanescent field and more energy is passed into the resonator than when the resonator is spaced further from the transmission line.

When the resonator is weakly coupled to the transmission line, typically meaning that the spacing between the resonator and the transmission line is substantial, the plot of Frequency vs. Energy, shown in FIG. 12, shows a small drop in energy at a particular frequency. However, in a conventionally coupled filter where the space between the resonator and the transmission line is less than in a weakly coupled filter, the plot of Frequency vs. Energy shown in FIG. 13 shows a much greater reduction in energy of the particular frequency.

FIGS. 14–16 pertain to another embodiment of the Mobius resonator. FIG. 14 shows a prior art 4 $\pi$ helix 1400 made from a single insulated wire with ends thereof unattached. FIG. 15 shows a 4 $\pi$ Mobius resonator 1500 made from a single insulated wire. Resonator 1500 has a lower loop 1502 which merges into upper loop 1504 and its ends are soldered together so that the resonator presents a continuous path. The loops in the resonator 1500 are of about the same diameter. FIG. 16 illustrates 8 $\pi$ Mobius resonator 1600 made from a single insulated wire composed of four loops with the two ends of the wire joined together. The loops in the resonator 1600 are of about of the same diameter.

It should be understood that the invention claimed herein involves the resonant interaction of electromagnetic energy with nonorientable surfaces and, as such, applies to all portions of the electromagnetic spectrum, including, but not limited, electrical, radio, microwave and optical signals.

The invention described herein, when used as a filter, in addition to offering dual mode resonances, contains two intrinsic transmission zeros. Transmission zeros are nulls in the transmitted energy and facilitate the design of filters with sharper selectivity. Prior art in filter design requires that additional resonators and/or couplings between resonators be employed to realize transmission zeros. The filter implementation described herein yields transmission zeros without additional circuitry. These transmission zeros are intrinsic to the operation of a filter composed of a series connected Mobius resonators.

The electromagnetic device claimed herein is often packaged inside a conducting container for the purpose of shielding the device from interacting with other electromagnetic devices and fields in an uncontrolled fashion. The container is often designed to control the interaction of the device (resonator) with other electromagnetic devices and fields. In the claims directed to the electromagnetic filter, the controlled coupling to an external circuit is often accomplished with a transmission line.

While presently preferred embodiments have been shown of the novel resonator and frequency filter, and of the several modifications discussed, persons skilled in this art will readily appreciate that various additional changes and modifications may be made without departing from the spirit of the invention as defined and differentiated by the following claims.

What is claimed is:

1. An electromagnetic filter comprising at least one dual mode resonator electromagnetically coupled in a controlled fashion to an external circuit when said at least one resonator each comprising an electromagnetic waveguiding structure of length L with n-fold rotational symmetry is realized by an n-conductor transmission line, where n is an integer greater than or equal to 2, wherein resonant frequencies of said resonator occur when L is a wavelength divided by n.

2. The filter of claim 1 wherein said structure comprises a two-conductor transmission line of a first conductor and a second conductor where each conductor is continuous and has first and second terminals, said first and second conductors each having first and second terminals, each of said conductors being insulated from each other, means for connecting said first terminal of said first conductor to said second terminal of said second conductor and means for connecting said second terminal of said first conductor to said first terminal of said second conductor to provide a continuous electrical path through said first and said second conductors.

3. The filter of claim 2 including an insulator, said first and said second conductors are strips mounted on said insulator having inner and outer edges, said cross-over including first means for electrically connecting said outer edge of said first conductor to said inner edge of said second conductor and said inner edge of said first conductor to said outer edge of said second conductor.

4. The filter of claim 3 wherein said conductors are mounted on opposite sides of said insulator, said insulator include at least two openings through which the electrical connections are made between said first and said second conductor.

5. The filter of claim 4 wherein said insulator is in the form of a rectangular thin object and wherein said conductors are continuous.

6. The filter of claim 5 wherein said first and second conductors are copper and wherein said resonator and said transmission lines are spaced from each other.

7. The filter of claim 5 wherein said resonator includes a plurality of spaced resonators arranged in series and said transmission line includes an input transmission line portion spaced from said resonators at one end thereof and an output transmission line spaced from said resonators at the other end thereof.

8. An electromagnetic dual mode resonator comprising a first and a second electrical conductors each of length L and each having first and second terminals, each of said conductors being electrically insulated from each other, and a cross-over which connects said first terminal of said first conductor to said second terminal of said second conductor and said second terminal of said first conductor to said first terminal of said second conductor to provide a continuous electrical path through said first and said second conductors, whose resonant frequencies occur when L is a half wavelength.

9. The resonator of claim 8 wherein said first and said second conductors are continuous and said cross-over is a 180° twist in said conductors.

10. The resonator of claim 8 including an insulator, said first and said conductors are strips mounted on said insulator having inner and outer edges, said cross-over including first means for electrically connecting said outer edge of said first conductor to said inner edge of said second conductor and said inner edge of said first conductor to said outer edge of said second conductor.

11. The resonator of claim 10 wherein said conductors are mounted on opposite sides of said insulator, said insulator include at least two openings through which the electrical connections are made between said first and said second conductor to implement the twist.

12. The resonator of claim 10 wherein said insulator is in the form of a rectangular thin object.

13. The resonator of claim 12 including at least two openings in said insulator board through which the electrical connections are made between said first and said second conductors, said conductor are mounted on opposite sides of said insulator board in mirror image to each other.

* * * * *